United States Patent
Kong et al.

(10) Patent No.: US 10,559,625 B1
(45) Date of Patent: Feb. 11, 2020

(54) RRAM CELLS IN CROSSBAR ARRAY ARCHITECTURE

(71) Applicant: INTERNATIONAL BUSINESS MACHINES CORPORATION, Armonk, NY (US)

(72) Inventors: Dexin Kong, Guilderland, NY (US); Takashi Ando, Tuckahoe, NY (US); Kangguo Cheng, Schenectady, NY (US); Juntao Li, Cohoes, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/058,374

(22) Filed: Aug. 8, 2018

(51) Int. Cl.
  *H01L 47/00* (2006.01)
  *H01L 27/24* (2006.01)
  *H01L 45/00* (2006.01)
  *G06N 3/04* (2006.01)

(52) U.S. Cl.
  CPC ...... *H01L 27/2463* (2013.01); *H01L 27/2436* (2013.01); *H01L 45/08* (2013.01); *H01L 45/1233* (2013.01); *H01L 45/1253* (2013.01); *H01L 45/145* (2013.01); *H01L 45/1608* (2013.01); *G06N 3/04* (2013.01)

(58) Field of Classification Search
  None
  See application file for complete search history.

(56) References Cited

U.S. PATENT DOCUMENTS

| 8,637,843 | B2* | 1/2014 | Asano ............ H01L 45/06 257/2 |
| 9,209,390 | B2 | 12/2015 | Satoh et al. |
| 9,620,174 | B2 | 4/2017 | Liu |
| 9,773,843 | B2 | 9/2017 | Vadivel Murugan |
| 9,806,256 | B1 | 10/2017 | Wu et al. |
| 9,853,091 | B2 | 12/2017 | Chou et al. |
| 2007/0158633 | A1 | 7/2007 | Lai et al. |
| 2008/0014750 | A1 | 1/2008 | Nagashima |
| 2008/0096344 | A1 | 4/2008 | Lai et al. |
| 2012/0001144 | A1* | 1/2012 | Greeley ............ H01L 27/2463 257/4 |

(Continued)

FOREIGN PATENT DOCUMENTS

WO  2018004562 A1  1/2018

OTHER PUBLICATIONS

Hayakawa et al., "Highly reliable Taox ReRAM with centralized filament for 28-nm embedded application", 2015 Symposium on VLSI Technology Digest of Technical Papers. Jun. 16-18, 2015. pp. 1-2.

(Continued)

*Primary Examiner* — Hung K Vu
(74) *Attorney, Agent, or Firm* — Tutunjian & Bitetto, P.C.; Vazken Alexanian

(57) ABSTRACT

A method is presented for forming vertical crossbar resistive random access memory (RRAM) cells. The method includes forming a substantially U-shaped bottom electrode over a substrate, filling the U-shaped bottom electrode with a first conductive material, capping the U-shaped bottom electrode with a dielectric cap, depositing a high-k material, and forming a top electrode such that active areas of the RRAM cells are vertically aligned and the U-shaped bottom electrode is shared between neighboring RRAM cells.

15 Claims, 10 Drawing Sheets

(56) References Cited

U.S. PATENT DOCUMENTS

2012/0100713 A1\* 4/2012 Kim .................. H01L 28/90
 438/656
2018/0012934 A1 1/2018 Bateman

OTHER PUBLICATIONS

Yu et al., "Novel Vertical 3D Structure of Taox-based RRAM with Self-localized Switching Region by Sidewall Electrode Oxidation", Scientific Reports. Feb. 17, 2016. pp. 1-10.

\* cited by examiner

US 10,559,625 B1

RRAM CELLS IN CROSSBAR ARRAY ARCHITECTURE

BACKGROUND

Technical Field

The present invention relates generally to semiconductor devices, and more specifically, to resistive random access memory (RRAM) cells in a crossbar array architecture having vertically aligned active areas.

Description of the Related Art

Resistive random access memory (RRAM) is considered a promising technology for electronic synapse devices or memristors for neuromorphic computing, as well as high-density and high-speed non-volatile memory applications. In neuromorphic computing applications, a resistive memory device can be employed as a connection (synapse) between a pre-neuron and post-neuron, representing the connection weight in the form of device resistance. Multiple pre-neurons and post-neurons can be connected through a crossbar array of RRAMs, which can express a fully-connected neural network configuration.

SUMMARY

In accordance with an embodiment, a method is provided for forming vertical crossbar resistive random access memory (RRAM) cells. The method includes forming a plurality of dielectric pillars over a substrate, forming a dielectric layer over the plurality of dielectric pillars, etching the dielectric layer to form dielectric regions between the plurality of dielectric pillars, forming a bottom electrode, filling the bottom electrode with a first conductive material, capping the bottom electrode with a dielectric cap, removing the dielectric pillars to form recesses, depositing a high-k material, and forming a top electrode such that active areas of the RRAM cells are vertically aligned and the bottom electrode is shared between neighboring RRAM cells.

In accordance with another embodiment, a method is provided for forming vertical crossbar resistive random access memory (RRAM) cells. The method includes forming a substantially U-shaped bottom electrode over a substrate, filling the U-shaped bottom electrode with a first conductive material, capping the U-shaped bottom electrode with a dielectric cap, depositing a high-k material; and forming a top electrode such that active areas of the RRAM cells are vertically aligned and the U-shaped bottom electrode is shared between neighboring RRAM cells.

In accordance with yet another embodiment, a semiconductor device is provided for forming vertical crossbar resistive random access memory (RRAM) cells. The semiconductor device includes a substantially U-shaped bottom electrode disposed over a substrate, a conductive material disposed within the U-shaped bottom electrode, a dielectric cap disposed over the U-shaped bottom electrode, a high-k material disposed over the U-shaped bottom electrode and the dielectric cap, and a top electrode constructed such that active areas of the RRAM cells are vertically aligned.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing resistive random access memory (RRAM) devices. The RRAMs can be employed for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing a connection weight in the form of device resistance. Multiple pre-neurons and post-neurons can be connected through a crossbar array of RRAMs, which can be configured as a fully-connected neural network. Large scale integration of large RRAM arrays with complementary metal oxide semiconductor (CMOS) circuits can enable scaling of RRAM devices down to 10 nm and beyond for neuromorphic computing as well as high-density and high-speed non-volatile memory applications.

Embodiments in accordance with the present invention provide methods and devices for forming high-density RRAM cells in a crossbar array architecture by employing self-aligning methods, the methods including two RRAM cells formed vertically on the sidewalls of one electrode and isolated from each other, thus enabling formation of a crossbar array structure with one word line and two bit lines. In addition, the vertical RRAM cell is not defined by the reactive etching and is thus free from process damage. The RRAM cells do not occupy the chip area and facilitate density scaling. The methods further make use of the self-aligning technique to integrate a high density of RRAM cells in a crossbar structure by sharing a bottom electrode between neighboring RRAM cells.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
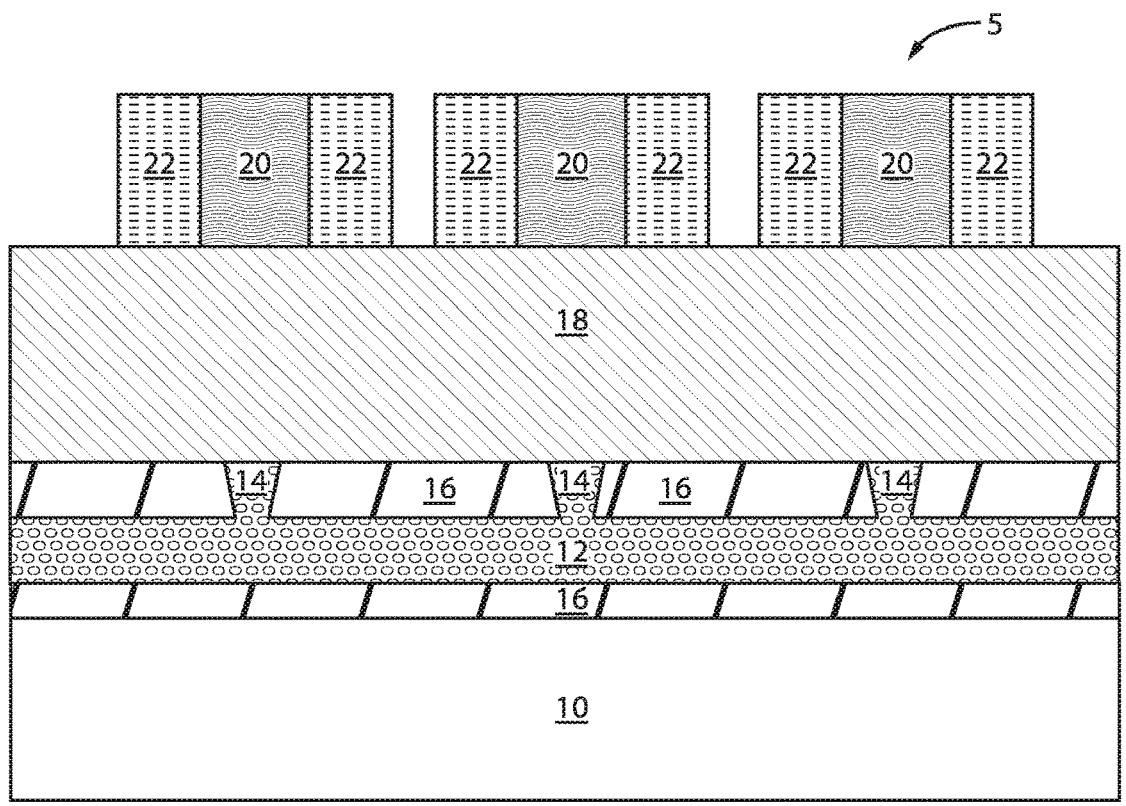
FIG. 1 is a cross-sectional view of a semiconductor structure including a plurality of spacers formed adjacent a hardmask and over a plurality of vias, in accordance with an embodiment of the present invention.

FIG. 1 is a cross-sectional view of a semiconductor structure including a plurality of spacers formed adjacent a hardmask and over a plurality of vias, in accordance with an embodiment of the present invention.

A semiconductor structure 5 can include an insulator 16 formed over a substrate 10. A metal line 12 and vias 14 can be formed in the insulator 16. The metal lines can be e.g., copper (Cu) lines. A dielectric layer 18 can be deposited over the insulator 16 and vias 14. The dielectric layer 18 can be, e.g., a nitride layer. A mandrel 20 can then be deposited over portions of the nitride layer 18. Spacers 22 are formed adjacent the mandrel 20.

The substrate 10 can include one or more semiconductor materials. Non-limiting examples of suitable substrate 10 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The dielectric material 16 of the initial structure can include any interlayer dielectric material (ILD) including inorganic dielectrics or organic dielectrics. The dielectric material 16 can be porous, non-porous or include regions and/or surfaces that are porous and other regions and/or surfaces that can be non-porous. Some examples of suitable dielectrics that can be used as the dielectric material 16 include, but are not limited to, silsesquioxanes, C doped oxides (e.g., organosilicates) that include atoms of Si, C, O and H, thermosetting polyarylene ethers, polyimides, polynorbornene, benzocyclobutene, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one or more embodiments, the dielectric material 16 has a dielectric constant that is less than silicon dioxide, i.e., less than 4.0. In another embodiment, the dielectric material 16 that can be employed in the present invention has a dielectric constant of 3.0 or less. All dielectric constants mentioned herein are relative to a vacuum, unless otherwise noted. Dielectrics which have a dielectric constant of less than that of silicon dioxide generally have a lower parasitic cross talk as compared with dielectric materials that have a higher dielectric constant equal to, or greater than, silicon dioxide. Generally, silicon dioxide has a dielectric constant of 4.0.

The initial structure that can be employed can include a dielectric material 16 that has at least one region of a conductive material 12 embedded, e.g., a metal conductor or metal line. A plurality of conductive materials 12 can be formed. Each region of conductive material 12 includes for example, polySi, silicon germanium (SiGe), a conductive metal, an alloy including at least two conductive metals, a conductive metal oxide, a conductive metal nitride, a conductive metal silicide or any combination thereof. In one embodiment, each region of conductive material 12 can include Al, W, Cu and/or a Cu alloy (such as AlCu). Each region of conductive material 12 can be formed by a deposition process including, for example, CVD, PECVD, PVD, sputtering, plating, chemical solution deposition and electroless plating.

Mandrel material layer 20 can include a polymer, for example, a random copolymer including repeat units derived from styrene, methylmethacrylate, or a combination including at least one of the foregoing. Mandrel material layer 20 can include an inorganic material such as, but not limited to, silicon dioxide, silicon nitride, and the like. Mandrel material layer 20 can be formed by, e.g., spin coating.

Spacers 22 can be arranged along sidewalls of the mandrel 20. The spacers 22 can include an insulating material, for example, silicon dioxide, silicon nitride, SiOCN, or SiBCN. Other non-limiting examples of materials for the spacers 22 can include dielectric oxides (e.g., silicon oxide), dielectric nitrides (e.g., silicon nitride), dielectric oxynitrides, or a combination including at least one of the foregoing. The spacer material 22 can be deposited by a deposition process, for example, chemical vapor deposition (CVD) or physical vapor deposition (PVD).

Figure 2:
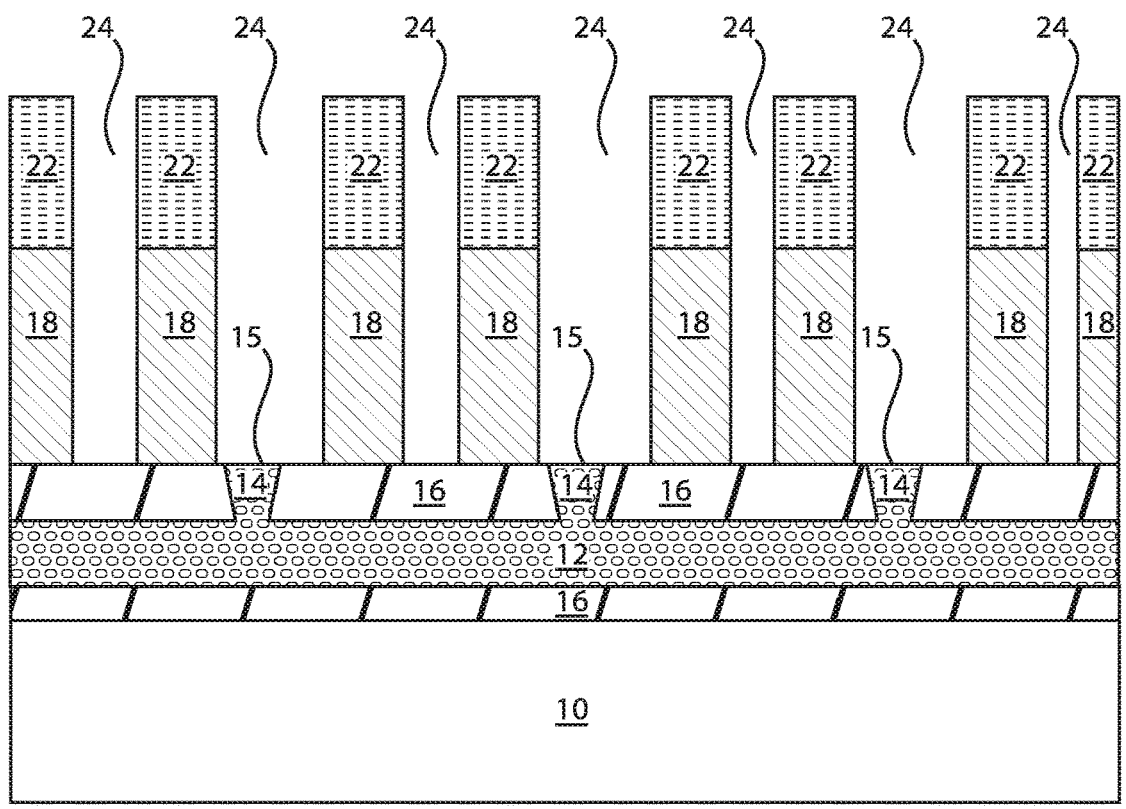
FIG. 2 is a cross-sectional view of the semiconductor structure of FIG. 1 where a dielectric layer is etched to expose the plurality of vias and form nitride pillars, in accordance with an embodiment of the present invention.

FIG. 2 is a cross-sectional view of the semiconductor structure of FIG. 1 where a dielectric layer is etched to expose the plurality of vias and form nitride pillars, in accordance with an embodiment of the present invention.

In various example embodiments, the mandrel 20 is removed and the nitride layer 18 is etched to form nitride pillars 18 having a nitride hardmask 22 thereon. A plurality of troughs 24 are formed between the nitride pillars 18. The etching of the nitride layer also results in top surface 15 of the vias 14 being exposed.

Figure 3:
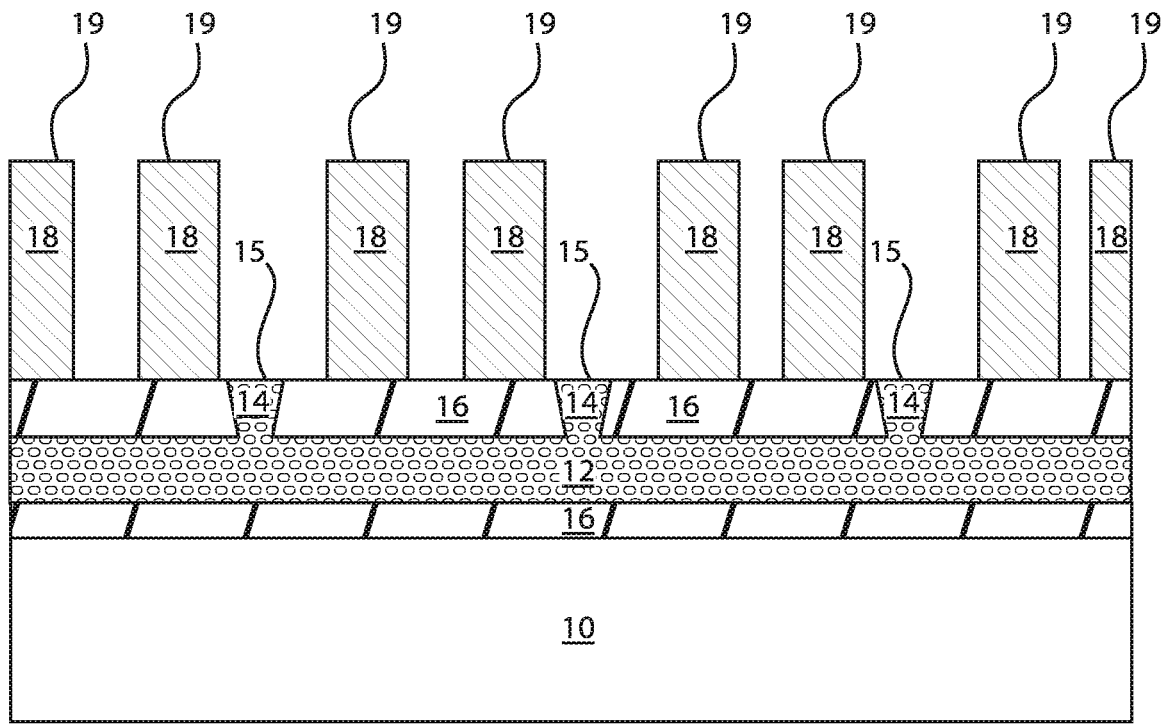
FIG. 3 is a cross-sectional view of the semiconductor structure of FIG. 2 where the hardmask is removed, in accordance with an embodiment of the present invention.

FIG. 3 is a cross-sectional view of the semiconductor structure of FIG. 2 where the hardmask is removed, in accordance with an embodiment of the present invention.

In various example embodiments, the hardmask 22 is removed thus exposing a top surface 19 of the nitride pillars 18.

Figure 4:
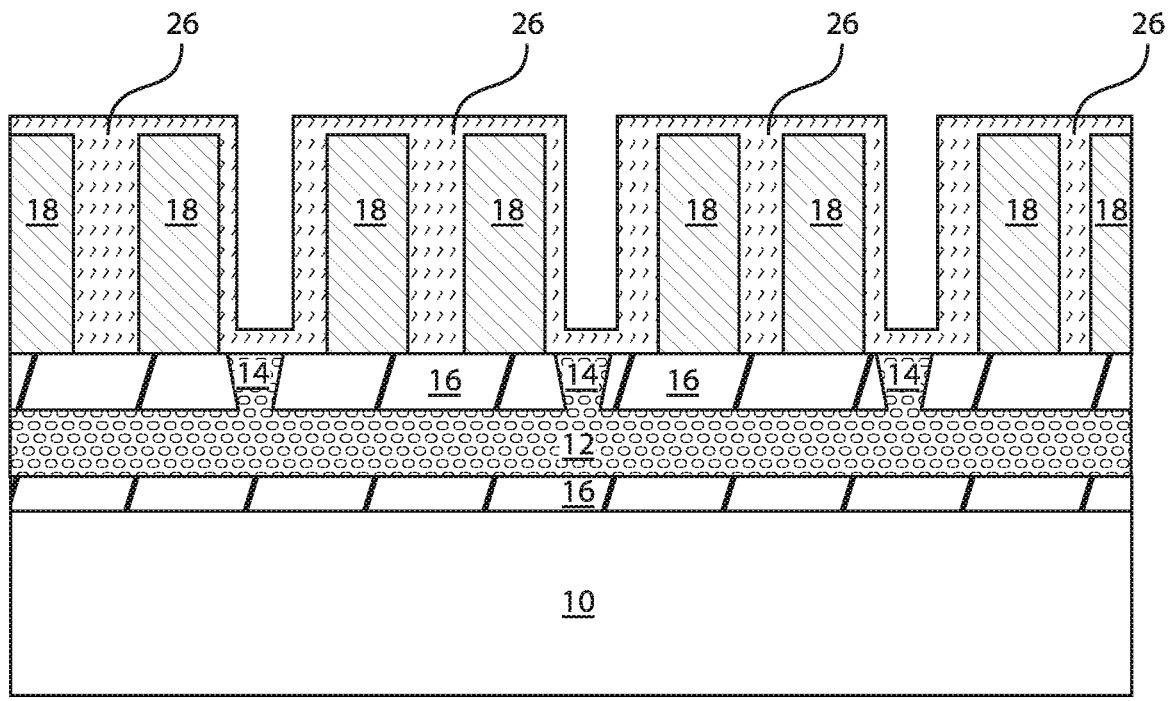
FIG. 4 is a cross-sectional view of the semiconductor structure of FIG. 3 where a dielectric is deposited, in accordance with an embodiment of the present invention.

FIG. 4 is a cross-sectional view of the semiconductor structure of FIG. 3 where a dielectric is deposited, in accordance with an embodiment of the present invention.

In various example embodiments, a dielectric layer 26 is deposited over the nitride pillars 18. The dielectric layer 26 can be an oxide layer. The oxide layer 26 pinches off the narrow space. Example materials of the oxide layer 26 can include silicon dioxide, aluminum oxide, zinc oxide, etc. In one implementation, the thickness in the z-axes of the oxide layer 26 can range from about 5-10 nm. The oxide layer 26 can be disposed using chemical vapor deposition (CVD), plasma enhanced chemical vapor deposition (PCVD), atomic layer deposition (ALD), plasma enhanced atomic layer deposition (PEALD), etc.

Figure 5:
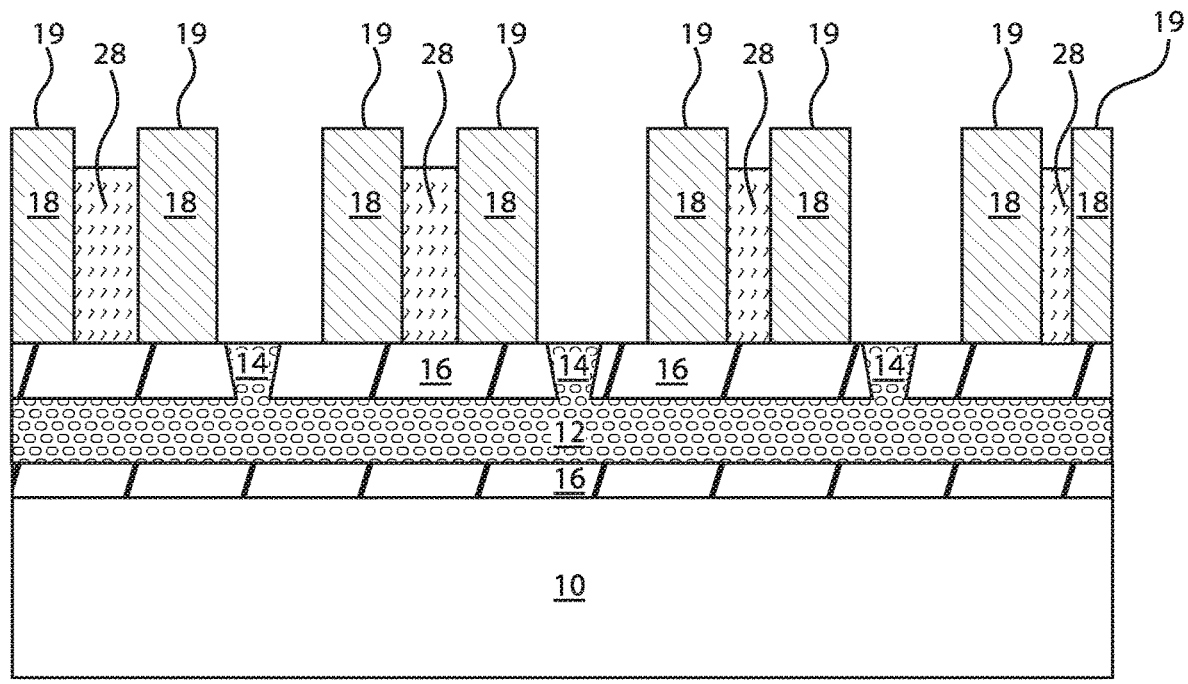
FIG. 5 is a cross-sectional view of the semiconductor structure of FIG. 4 where the dielectric is etched such that dielectric portions remain between the nitride pillars, in accordance with an embodiment of the present invention.

FIG. 5 is a cross-sectional view of the semiconductor structure of FIG. 4 where the dielectric is etched such that dielectric portions remain between the nitride pillars, in accordance with an embodiment of the present invention.

In various example embodiments, the oxide layer 26 is etched (e.g., isotropic etch) such that oxide portions 28 remain between nitride pillars 18. Non-limiting examples of suitable etching processes include silicon etching methods selective to oxides. As used herein, the reactive ion etching (RIE) can include a simultaneous exposure to hydrogen ($H_2$), nitrogen trifluoride ($NF_3$), and ammonia ($NH_3$) plasma by-products (SiCoNi process).

Figure 6:
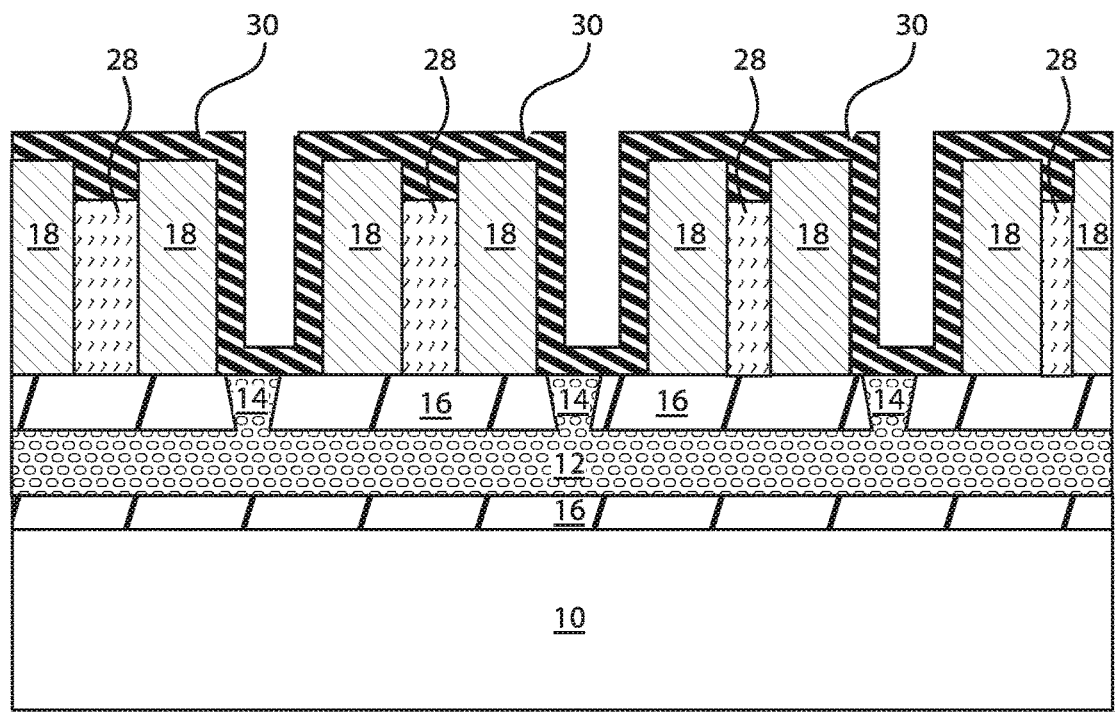
FIG. 6 is a cross-sectional view of the semiconductor structure of FIG. 5 where a bottom electrode is deposited, in accordance with an embodiment of the present invention.

FIG. 6 is a cross-sectional view of the semiconductor structure of FIG. 5 where a bottom electrode is deposited, in accordance with an embodiment of the present invention.

In various example embodiments, a bottom electrode 30 is deposited. The bottom electrode 30 can include a conductive material, such as Cu, Al, Ag, Au, Pt, W, etc. In some embodiments, the bottom electrode 30 can include nitrides such as TiN, TaN, Ta or Ru. In a preferred embodiment, the bottom electrode 30 is TiN.

Figure 7:
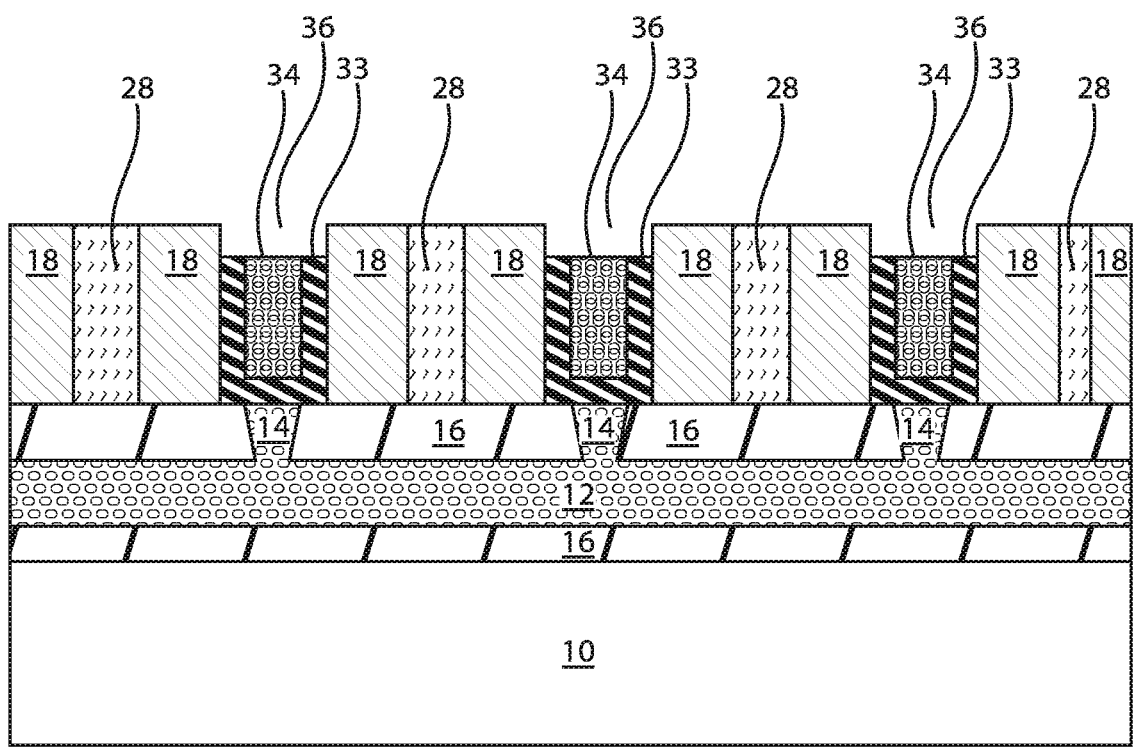
FIG. 7 is a cross-sectional view of the semiconductor structure of FIG. 6 where a metal fill takes place, in accordance with an embodiment of the present invention.

FIG. 7 is a cross-sectional view of the semiconductor structure of FIG. 6 where a metal fill takes place, in accordance with an embodiment of the present invention.

In various example embodiments, a conductive material 34 can be deposited within the remaining bottom electrode portions, and a recess 36 can then take place. The recess 36 results in substantially U-shaped bottom electrode portions 33 filled with conductive material 34.

Non-limiting examples of conductive metals 34 include aluminum (Al), platinum (Pt), gold (Au), tungsten (W), titanium (Ti), or a combination including at least one of the foregoing. The conductive metal 34 can be deposited by a suitable deposition process, for example, CVD, PECVD, PVD, plating, thermal or e-beam evaporation, and sputtering. A planarization process, for example, chemical mechanical planarization (CMP), can be performed to polish the surface of the conductive metal.

Figure 8:
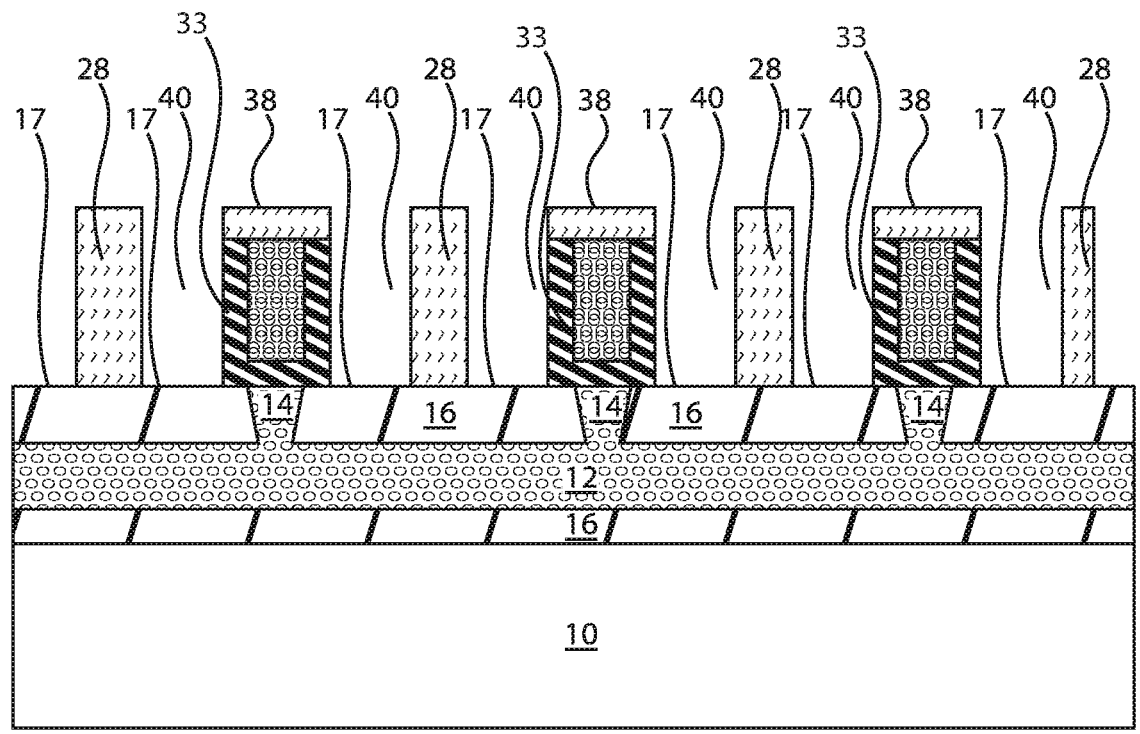
FIG. 8 is a cross-sectional view of the semiconductor structure of FIG. 7 where the nitride pillars are removed, in accordance with an embodiment of the present invention.

FIG. 8 is a cross-sectional view of the semiconductor structure of FIG. 7 where the nitride pillars are removed, in accordance with an embodiment of the present invention.

In various example embodiments, an oxide insulator 38 is deposited over the U-shaped bottom electrodes 33. In one example, the oxide insulator 38 can be of the same material as oxide portions 28. The oxide insulator 38 can be reduced by chemical-mechanical polishing (CMP) and/or etching. Therefore, the planarization process can be provided by CMP. Other planarization process can include grinding and polishing. Thus, the top surface of the oxide insulator 38 can be flush with a top surface 19 of the nitride pillars 18.

Subsequently, the nitride pillars 18 are removed. The removal of the nitride pillars 18 results in openings or trenches 40 formed adjacent the U-shaped bottom electrodes 33. Additionally, a top surface 17 of the insulator 16 is now exposed.

Figure 9:
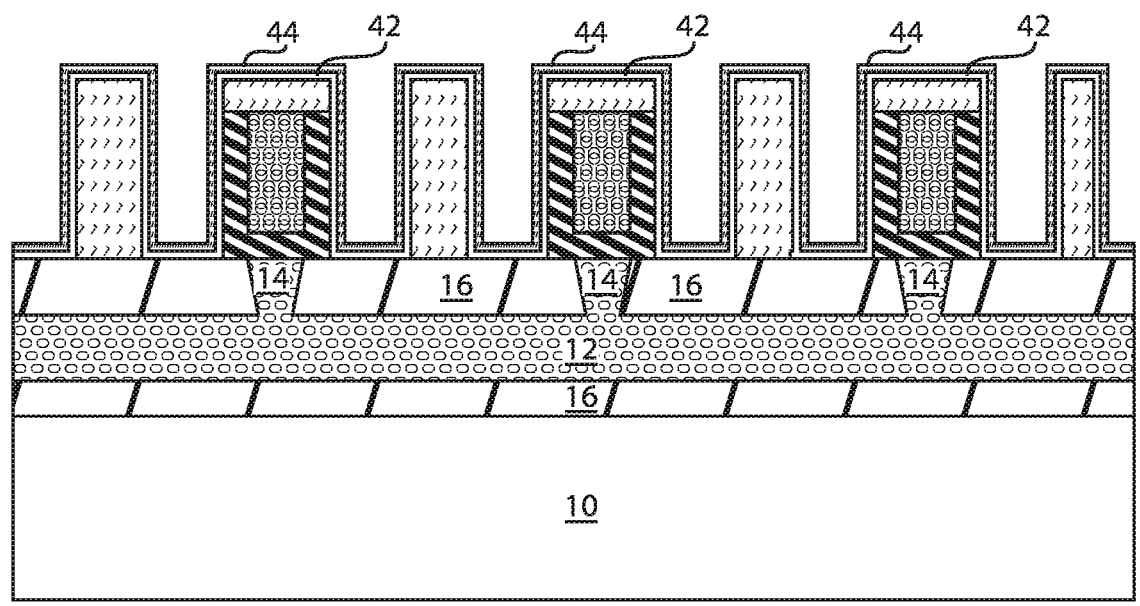
FIG. 9 is a cross-sectional view of the semiconductor structure of FIG. 8 where a high-k material and a top electrode are deposited, in accordance with an embodiment of the present invention.

FIG. 9 is a cross-sectional view of the semiconductor structure of FIG. 8 where a high-k material and a top electrode are deposited, in accordance with an embodiment of the present invention.

In various example embodiments, a high-k material 42 can be deposited.

The high-k material 42 can include but is not limited to work function metals such as titanium nitride, titanium carbide, titanium aluminum carbide, tantalum nitride and tantalum carbide; conducting metals such as tungsten, aluminum and copper; and oxides such as silicon dioxide ($SiO_2$), hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

Additionally, a top electrode 44 is deposited. The top electrode 44 can include a conductive material, such as Cu, Al, Ag, Au, Pt, W, etc. In some embodiments, the top electrode 44 can include nitrides such as TiN, TaN, Ta or Ru. In a preferred embodiment, the top electrode 44 is TiN/Al-containing alloy/TiN. The top electrode 44, the high-k material 42 and a section of the bottom electrode 33 can form a RRAM cell.

Figure 10:
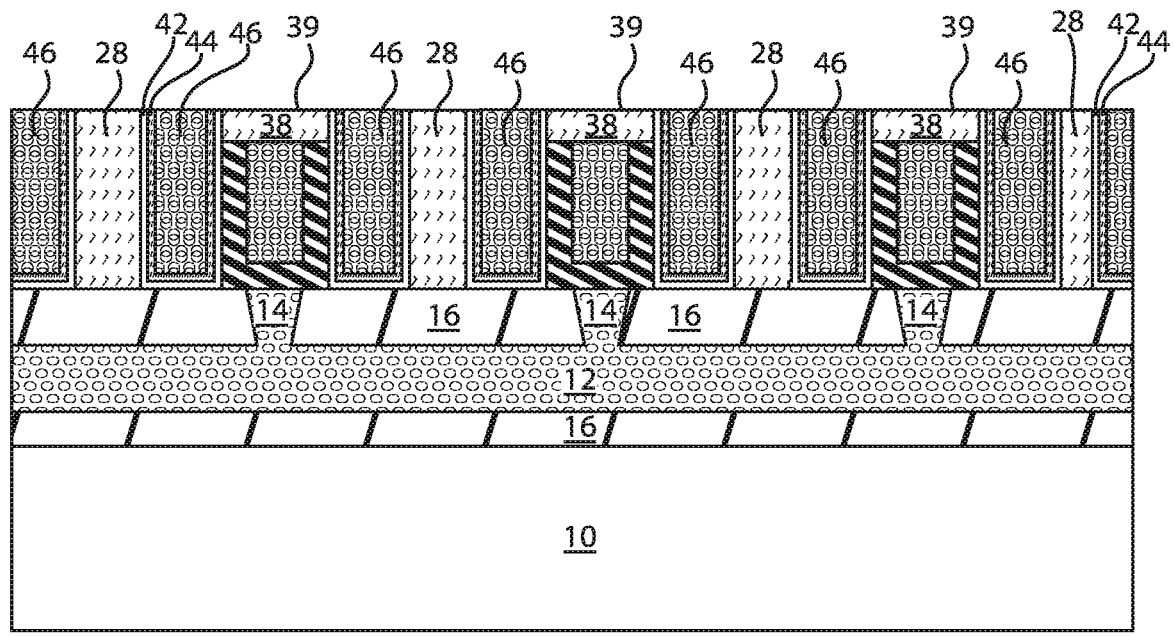
FIG. 10 is a cross-sectional view of the semiconductor structure of FIG. 9 where a metal fill takes place, in accordance with an embodiment of the present invention.

FIG. 10 is a cross-sectional view of the semiconductor structure of FIG. 9 where a metal fill takes place, in accordance with an embodiment of the present invention.

In various example embodiments, a metal fill 46 takes place and CMP is performed to expose a top surface 39 of the oxide insulator 38. As a result, the substantially U-shaped bottom electrode 33 is shared between neighboring RRAM cells. All the active areas across the device are vertical. The RRAM cell can include a portion of the bottom electrode 33, the high-k material 42, and the top electrode 44. The RRAM cell is perpendicular to the substrate 10. Stated differently, the RRAM cells are formed vertically on the sidewalls of one electrode (i.e., the bottom electrode 33), and the RRAM cells are isolated from each other. Both the bottom electrode 33 and the top electrode 44 are vertically oriented with respect to the substrate 10. Moreover, only one sidewall active region is present per memory cell. Therefore, each sidewall of the bottom electrode 33 is part of a RRAM cell, which results in higher density of crossbar cells.

Figure 11:
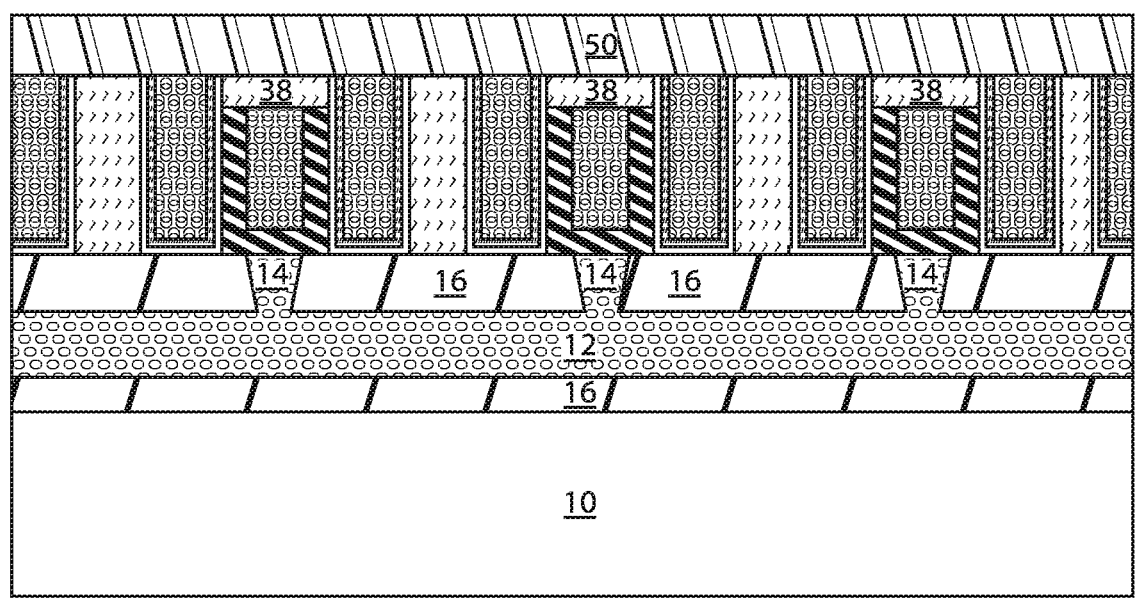
FIG. 11 is a cross-sectional view of the semiconductor structure of FIG. 10 where a mask is deposited, the view being parallel to the mask, in accordance with an embodiment of the present invention.

FIG. 11 is a cross-sectional view of the semiconductor structure of FIG. 10 where a mask is deposited, the view being parallel to the mask, in accordance with an embodiment of the present invention.

In various example embodiments, a patterning mask 50 is deposited. Mask layer 50 can be any suitable resist. Suitable resists include photoresists, electron-beam resists, ion-beam resists, X-ray resists, and etchant resists. The resist can include a polymeric material, for example, that can be applied by spin casting. Mask layer 50 can be formed by spin coating a photo resist material followed by photolithography.

Figure 12:
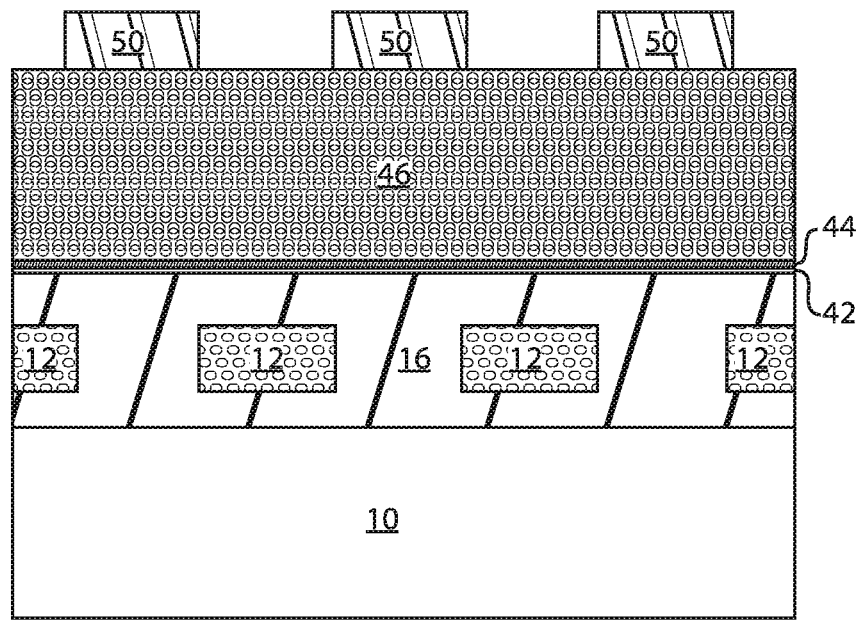
FIG. 12 is a cross-sectional view of the semiconductor structure of FIG. 10 where a mask is deposited, the view being perpendicular to the mask, in accordance with an embodiment of the present invention.

FIG. 12 is a cross-sectional view of the semiconductor structure of FIG. 10 where a mask is deposited, the view being perpendicular to the mask, in accordance with an embodiment of the present invention.

The mask layer 50 is shown formed over the conductive material 46.

Figure 13:
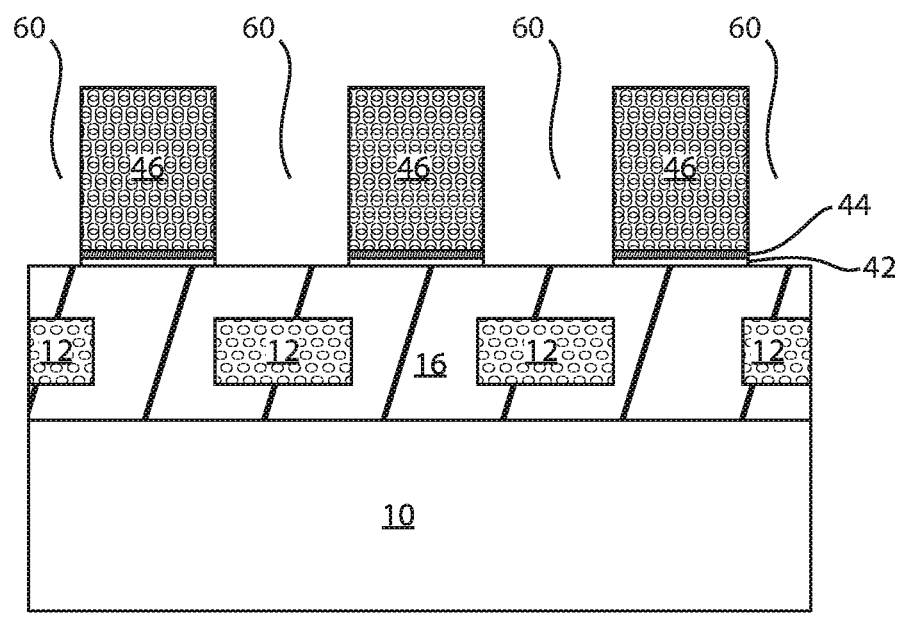
FIG. 13 is a cross-sectional view of the semiconductor structure of FIG. 12 where the mask is removed, in accordance with an embodiment of the present invention.

FIG. 13 is a cross-sectional view of the semiconductor structure of FIG. 12 where the mask is removed, in accordance with an embodiment of the present invention.

In various example embodiments, the mask 50 can be removed by, for example, an ashing process. In other embodiments, mask layer 50 can be removed, for example, using a solvent or an aqueous developer, for example, using N-methyl-2-pyrrolidone (NMP), toluene, propylene glycol methyl ether acetate (PGMEA), tetramethylammonium hydroxide (TMAH), or a combination including at least one of the foregoing.

Figure 14:
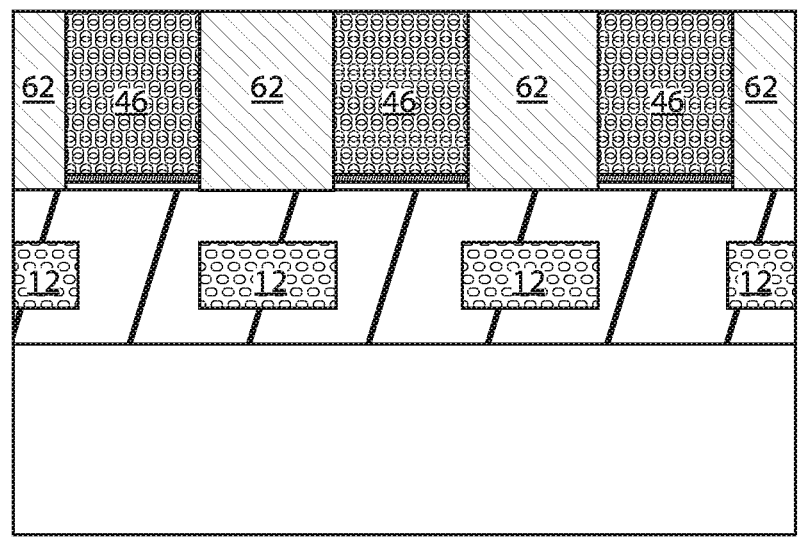
FIG. 14 is a cross-sectional view of the semiconductor structure of FIG. 13 where a dielectric is deposited in the recesses formed by the removal of the mask, in accordance with an embodiment of the present invention.

FIG. 14 is a cross-sectional view of the semiconductor structure of FIG. 13 where a dielectric is deposited in the recesses formed by the removal of the mask, in accordance with an embodiment of the present invention.

In various example embodiments, a dielectric material 62 is deposited. The dielectric material 62 can be an interlayer dielectric.

The ILD 62 can include any materials known in the art, such as, for example, porous silicates, carbon doped oxides, silicon dioxides, silicon nitrides, silicon oxynitrides, or other dielectric materials. The ILD 62 can be formed using any method known in the art, such as, for example, chemical vapor deposition, plasma enhanced chemical vapor deposition, atomic layer deposition, or physical vapor deposition. The ILD 62 can have a thickness ranging from about 25 nm to about 200 nm.

The dielectric material of layer 62 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The dielectric material 62 can be reduced by chemical-mechanical polishing (CMP) and/or etching. Therefore, the planarization process can be provided by CMP. Other planarization process can include grinding and polishing.

Figure 15:
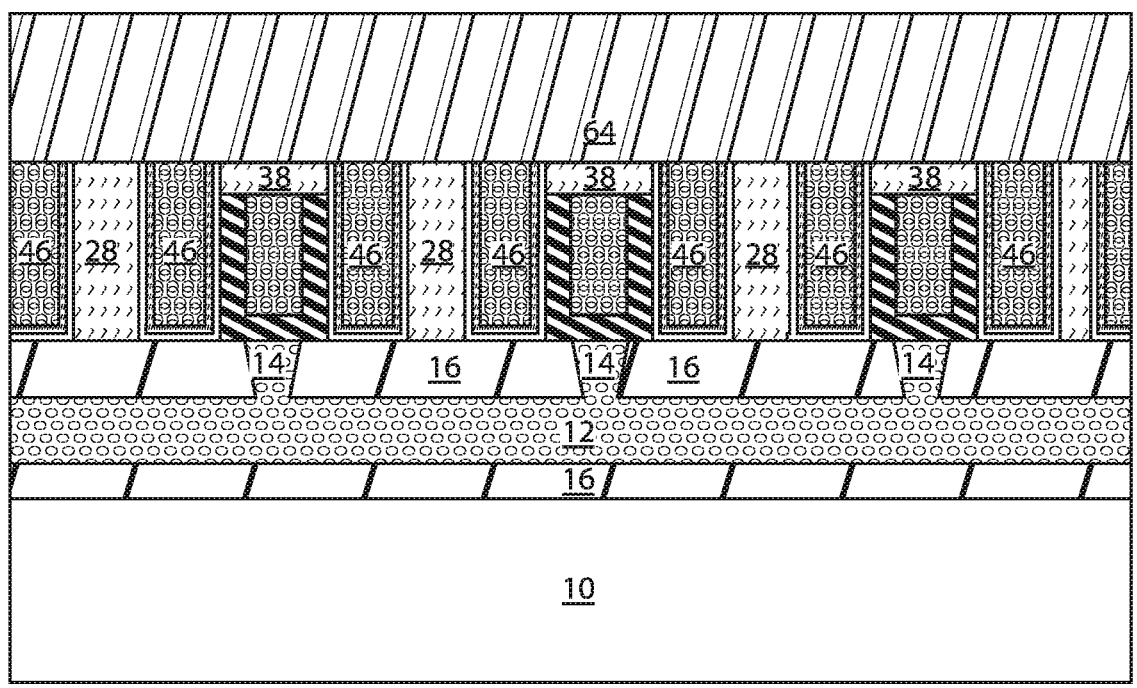
FIG. 15 is a cross-sectional view of the semiconductor structure of FIG. 11 where an insulator cap is deposited, in accordance with an embodiment of the present invention.

FIG. 15 is a cross-sectional view of the semiconductor structure of FIG. 11 where an insulator cap is deposited, in accordance with an embodiment of the present invention.

In various example embodiments, a dielectric capping layer 64 is deposited.

The dielectric capping layer 64 can be formed utilizing a deposition process such as, for example, CVD, PECVD, chemical solution deposition, or evaporation. The dielectric capping layer 64 can include any suitable dielectric capping material such as, for example, SiC, $Si_3N_4$, $SiO_2$, a carbon doped oxide, a nitrogen and hydrogen doped silicon carbide SiC(N,H) or multilayers thereof. The thickness of the dielectric capping layer 64 can vary depending on the technique used to form the same as well as the material make-up of the layer. Usually, the dielectric capping layer 64 can have a thickness from 15 nm to 55 nm, with a thickness from 25 nm to 45 nm.

Figure 16:
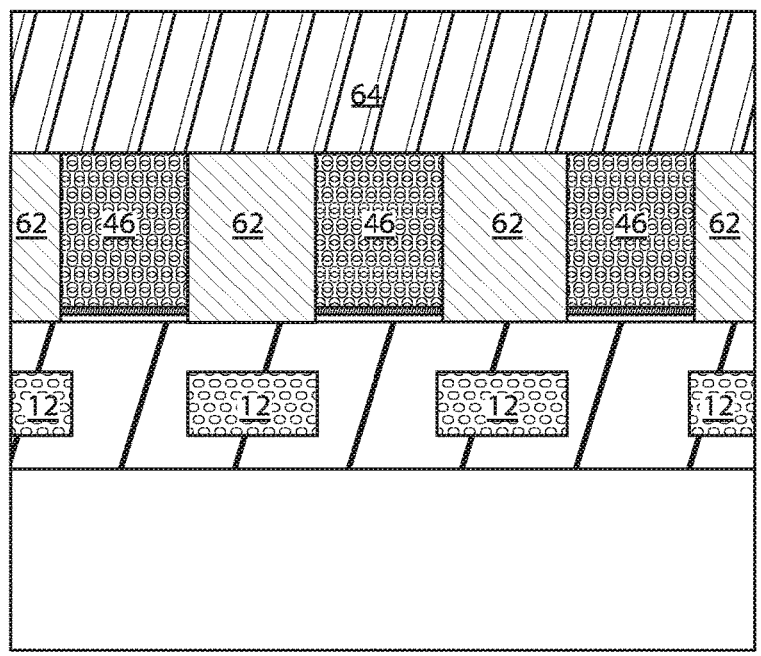
FIG. 16 is a cross-sectional view of the semiconductor structure of FIG. 14 where an insulator cap is deposited, in accordance with an embodiment of the present invention.

FIG. 16 is a cross-sectional view of the semiconductor structure of FIG. 14 where an insulator cap is deposited, in accordance with an embodiment of the present invention.

The dielectric capping layer 64 is shown to be formed over the dielectric material 62 and over the conductive material 46.

Figure 17:
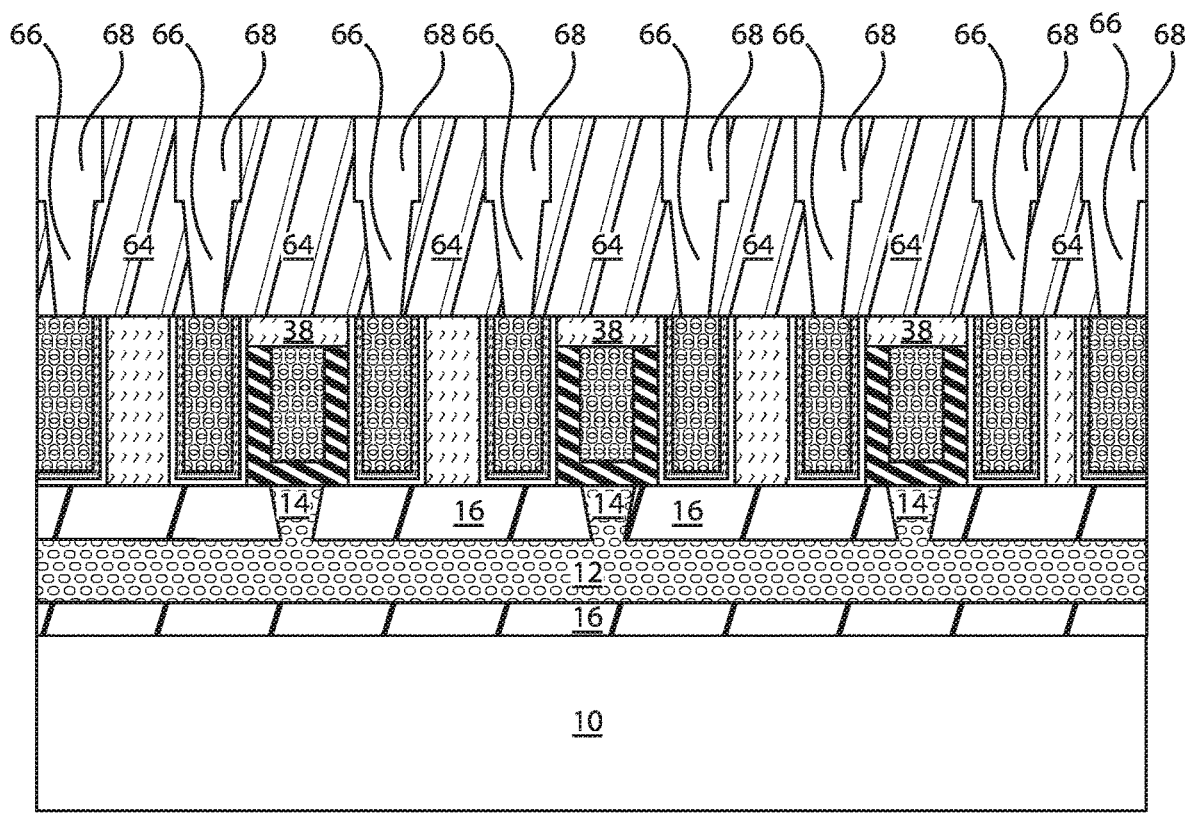
FIG. 17 is a cross-sectional view of the semiconductor structure of FIG. 15 where top electrode patterning and metallization takes place, in accordance with an embodiment of the present invention.

FIG. 17 is a cross-sectional view of the semiconductor structure of FIG. 15 where top electrode patterning and metallization takes place, in accordance with an embodiment of the present invention.

In various example embodiments, vias 66 and metal lines 68 are formed in the dielectric capping layer 64. The metal lines 68 can be copper (Cu) lines.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

Figure 18:
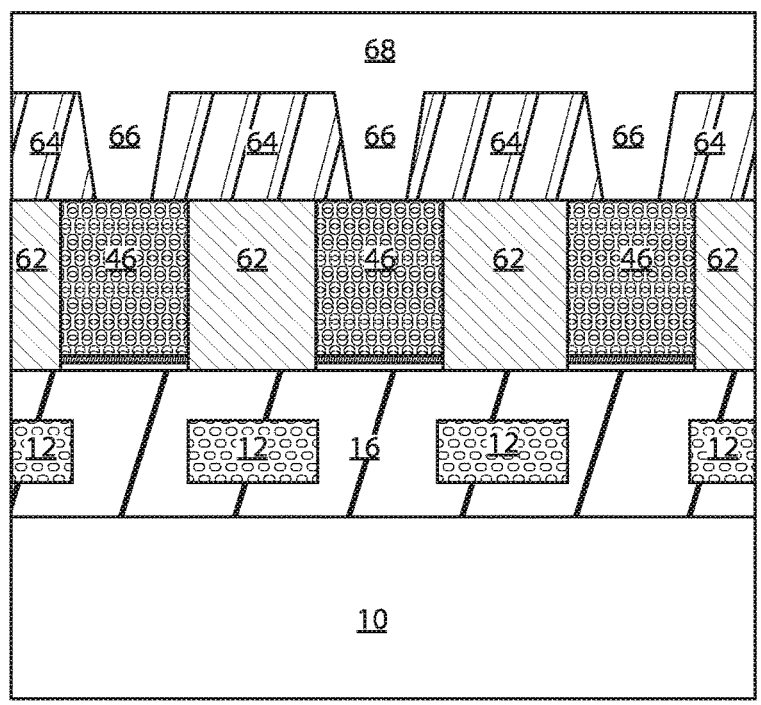
FIG. 18 is a cross-sectional view of the semiconductor structure of FIG. 16 where top electrode patterning and metallization takes place, in accordance with an embodiment of the present invention.

FIG. 18 is a cross-sectional view of the semiconductor structure of FIG. 16 where top electrode patterning and metallization takes place, in accordance with an embodiment of the present invention.

The vias 66 are shown directly contacting the top surface of the conductive material 46. The metal line 68 contacts all of the vias 66.

Figure 19:
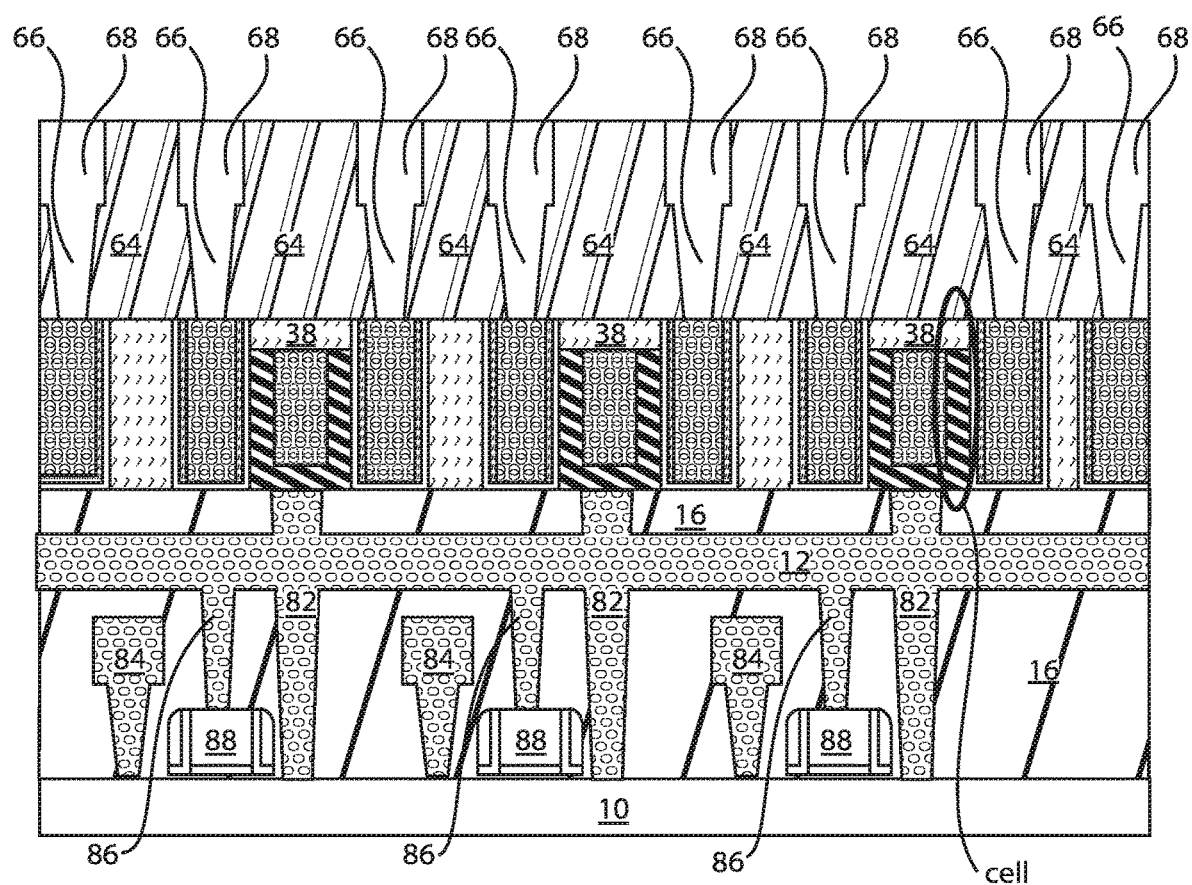
FIG. 19 is a cross-sectional view of the semiconductor structure of FIG. 17 where field effect transistors (FETs) are incorporated into the lower insulator, in accordance with another embodiment of the present invention.

FIG. 19 is a cross-sectional view of the semiconductor structure of FIG. 17 where field effect transistors (FETs) are incorporated into the lower insulator, in accordance with another embodiment of the present invention.

In various example embodiments, vias 82 can be formed between the substrate 10 and the bottom electrode 33.

Additionally, vias 86 can be formed between field effect devices 88 and the metal line 12. In other embodiments, vias 84 can be formed to other metal lines constructed within the insulator 16.

In conclusion, the exemplary embodiments of the present invention employ a method of forming high density RRAM cells in a crossbar array architecture by employing self-aligning methods, the methods including two RRAM cells formed vertically on the sidewalls of one electrode and isolated from each other, thus enabling formation of a crossbar array structure with one word line and two bit lines. In addition, the vertical RRAM cell is not defined by the reactive etching, and, thus, is free from process damage. The RRAM cells do not occupy the chip area and facilitate density scaling. The methods make use of a self-aligning technique to integrate high density of RRAM cells in a crossbar structure by sharing a bottom electrode between neighboring RRAM cells. In other words, two RRAM cells are formed vertically on the sidewalls of one electrode (i.e., bottom electrode) and the RRAM cells are isolated with respect to each other.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing resistive random access memory (RRAM) cells in crossbar array architectures being vertically aligned or oriented (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming vertical crossbar resistive random access memory (RRAM) cells, the method comprising:
    forming a substantially U-shaped bottom electrode over a substrate;
    filling the U-shaped bottom electrode with a first conductive material;
    capping the U-shaped bottom electrode with a dielectric cap;
    depositing a high-k material; and
    forming a top electrode such that active areas of the RRAM cells are vertically aligned and the U-shaped bottom electrode is shared between neighboring RRAM cells.

2. The method of claim 1, further comprising, before forming the U-shaped bottom electrode:
    forming a plurality of dielectric pillars over a substrate;
    forming a dielectric layer over the plurality of dielectric pillars; and
    etching the dielectric layer to form dielectric regions between the plurality of dielectric pillars.

3. The method of claim 2, further comprising, after forming the U-shaped bottom electrode, removing the dielectric pillars to form recesses.

4. The method of claim 3, further comprising filling the recesses with a second conductive material.

5. The method of claim 4, further comprising forming first vias in direct contact with the second conductive material.

6. The method of claim 5, further comprising forming second vias between the substrate and the U-shaped bottom electrode.

7. The method of claim 6, wherein the plurality of dielectric pillars include nitride pillars and the dielectric layer includes an oxide layer.

8. The method of claim 7, wherein the high-k material includes titanium nitride (TiN) and the top electrode includes TiN/aluminum (Al)-containing alloy/TiN.

9. A method for forming vertical crossbar resistive random access memory (RRAM) cells, the method comprising:
    forming a plurality of dielectric pillars over a substrate;
    forming a dielectric layer over the plurality of dielectric pillars;
    etching the dielectric layer to form dielectric regions between the plurality of dielectric pillars;
    forming a bottom electrode;
    filling the bottom electrode with a first conductive material;
    capping the bottom electrode with a dielectric cap;
    removing the dielectric pillars to form recesses;
    depositing a high-k material; and
    forming a top electrode such that active areas of the RRAM cells are vertically aligned and the bottom electrode is shared between neighboring RRAM cells.

10. The method of claim 9, wherein the bottom electrode includes one or more substantially U-shaped electrodes.

11. The method of claim 10, further comprising filling the recesses with a second conductive material.

12. The method of claim 11, further comprising forming vias in direct contact with the second conductive material.

13. The method of claim 11, further comprising forming vias between the substrate and the bottom electrode.

14. The method of claim 9, wherein the plurality of dielectric pillars include nitride pillars and the dielectric layer includes an oxide layer.

15. The method of claim 9, wherein the high-k material includes titanium nitride (TiN) and the top electrode includes TiN/Al-containing alloy/TiN.

* * * * *